United States Patent [19]

Hornak et al.

[11] Patent Number: 4,587,477
[45] Date of Patent: May 6, 1986

[54] BINARY SCALED CURRENT ARRAY SOURCE FOR DIGITAL TO ANALOG CONVERTERS

[75] Inventors: Thomas Hornak, Portola Valley; Gary L. Baldwin, Palo Alto; Ronald W. Potter, Saratoga, all of Calif.

[73] Assignee: Hewlett-Packard Company, Palo Alto, Calif.

[21] Appl. No.: 611,803

[22] Filed: May 18, 1984

[51] Int. Cl.$^4$ ............................................... G05F 3/16
[52] U.S. Cl. .................................. 323/312; 323/317; 340/347 DA; 340/347 CC
[58] Field of Search ...................... 323/311, 312, 317; 340/347 DA, 347 CC

[56] References Cited

U.S. PATENT DOCUMENTS

| Re. 29,619 | 4/1978 | Pastoriza | 323/312 |
|---|---|---|---|
| 2,907,021 | 9/1959 | Woods | 340/347 DA |
| 3,831,167 | 8/1974 | Tewksbury | 340/347 DA |
| 3,982,172 | 9/1976 | van de Plessche | 323/317 |
| 4,225,816 | 9/1980 | Schade | 323/317 |
| 4,458,201 | 7/1984 | Koen | 323/317 |

*Primary Examiner*—William H. Beha, Jr.
*Attorney, Agent, or Firm*—John A. Frazzini

[57] ABSTRACT

A binary scaled current source in which a set of binary switches $M_1, \ldots, M_n$ controllably switch a current I to a selected one of a set of n outputs. Each switch $M_k$ is controlled by an associated control signal $B_k$ having a duty cycle of $2^{k-n-1}$. At any given time one and only one of the control signals is high so that the current I is diverted to the kth output a fraction $2^{k-n-1}$ of the time. In two particular schemes referred to as the weighted pulse width (WPW) and the weighted repetition rate (WRR) schemes, all of the control signals are periodic with a group pattern repetition period T. In the WPW scheme, $B_k$ has in each period T a single pulse of duration $2^{k-n-1}*T$. In the WRR scheme, $B_k$ has in each period $T2^{k-1}$ pulses each of duration $2^{-n}*T$. The output of each binary switch is typically passed through a low pass filter which conducts substantially only the dc component of the output current from the binary switch to which it is connected. These dc components serve as a set of binary scaled dc currents. Pulsing switches are also added between the source of current I and the binary switches to provide the current I in pulses that do not overlap any of the transitions in the control signals so that the binary scaled currents that are produced are insensitive to timing of the transitions in the control signals.

1 Claim, 15 Drawing Figures

BINARY SCALED CURRENT ARRAY SOURCE FOR DIGITAL TO ANALOG CONVERTERS

BACKGROUND OF THE INVENTION

This invention relates in general to binary scaled current sources and more particularly to such a source utilizing current switching. In a common approach to n-bit digital to analog (D/A) converters, a current source provides a set of dc currents of magnitude $I_k = 2^{k-1}*I_1$ for $k=1$ to n, where $I_1$ is the magnitude of the least significant current provided by the source. In response to an input binary number, a control section of the D/A converter directs to the output of the D/A converter selected ones of the currents $I_k$. In general, the current $I_k$ is directed to the converter output if and only if the kth least significant bit of the binary number is a one. The sum of all of these currents directed to converter output is therefore proportional to the binary number.

Figure 13:
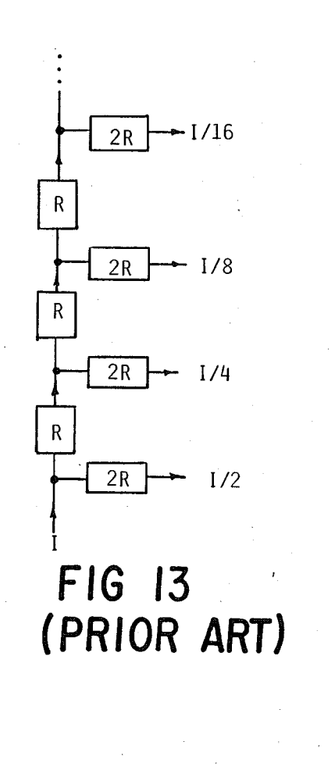
FIG. 13 is an R-2R ladder used in the prior art to produce binary scaled currents.

In actual practice, the ratio between successive $I_k$ is not exactly 2 because there are small errors in the $I_k$. Each of these errors should be small compared to the least significant current $I_1$ so that the output current is generated to n-bits accuracy. As the number of bits of precision increases, the difficulty of producing correspondingly precise $I_k$ becomes increasingly difficult. In one type of binary scaled current source, the $I_k$ are generated by an R-2R ladder as shown in FIG. 13. The precision of each of the $I_k$ is determined by the precision of the resistance values of the elements in the R-2R ladder and by the uniformity of the voltage on the right hand side terminals of all 2R resistors. For D/A converters of resolution greater than 10 bits, precisely matched resistors are produced in a monolithic form of reasonable chip-area only with the use of expensive laser trimming or selective Zener diode shorting techniques after fabrication.

Figure 14:
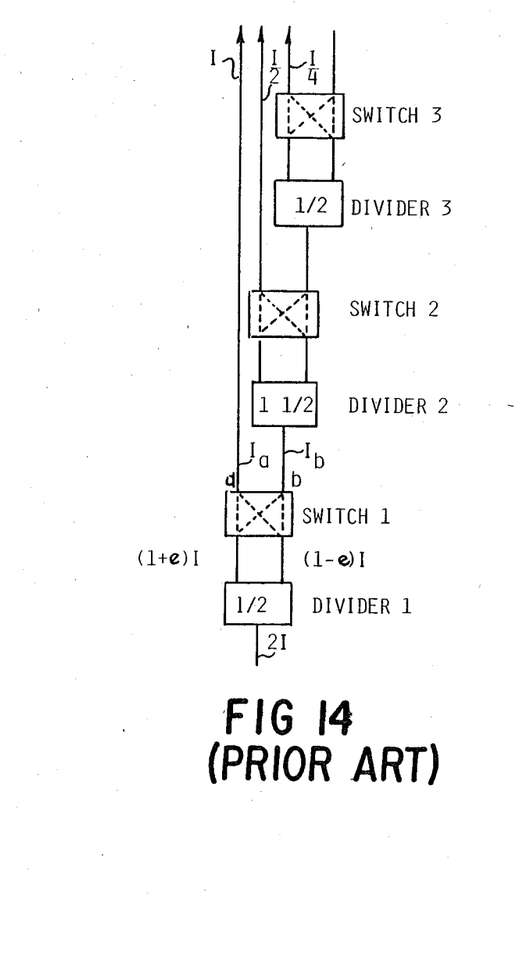
FIG. 14 is a prior art binary scaled current source utilizing time multiplexing to reduce current errors due to mismatch of circuit components.

In a technique illustrated in FIG. 14 and presented by R. J. Van de Plassche in the article "Dynamic Element Matching for High Accuracy Monolithic D/A Converters", IEEE JSSC, pp. 795-800, vol. Sc-11, no.6, December 1976, the precision required for components of the current source is relieved somewhat by use of current switches that interleave currents to average out errors caused by imperfect matching of components. In that approach, a current of magnitude 2I is supplied to a first divider that is to produce two currents each of magnitude I. However, because of mismatch between components of the first divider, a first one of the currents has magnitude $(1+e)*I$ and the second of the currents has magnitude $(1-e)*I$, where e is a measure of the error in the two resulting currents. These two currents are supplied to a first switch which is responsive to a clock having a 50% duty cycle. During the first half of a clock cycle, the first current is directed to an output a and the second of the currents is directed to an output b. In the other half of the clock cycle, the first current is directed to output b and the second current is directed to output a. If the duty cycle were exactly 50%, then the average current $I_a$ at output a and the average current $I_b$ at output b would each equal I.

In general, the duty cycle is 50% plus some fractional error f (i.e., the duty cycle is $0.5*(1+f)$) so that the current $I_a$ is equal to $(1+ef)*I$ and $I_b$ is equal to $(1-ef)*I$. Because the error is now ef instead of e, the precision of the components in the first switch and divider can be relaxed somewhat without reduction in the precision of $I_a$ and $I_b$. A series of dividers and switches can be cascaded as in FIG. 14 to produce a set of binary scaled output currents for use in a D/A converter. Although this technique reduces somewhat the precision required for elements, the scheme is still inherently limited by such precision as well as the precision of the duty cycle. It would therefore be advantageous to have a new type of source of binary scaled currents that is not so limited.

SUMMARY OF THE INVENTION

In accordance with the illustrated preferred embodiments, a binary scaled current source is presented that utilizes a binary relation between the duty cycles of control signals to generate binary scaled currents. This scheme is referred to herein as the "weighted duty cycle" (WDC) scheme. A D/A converter is also shown that utilizes this current source.

The binary scaled current source utilizes an n-bit binary counter and decoding logic to generate a set of $n+1$ control signals $B_k$ for $k=0, \ldots, n$. The duty cycle for the kth control signal (for $k=1$ to n) is $2^{k-1}$ times the duty cycle of the zeroth control signal. A set of $n+1$ switches $M_0, \ldots, M_n$ are connected in parallel to a dc current source of magnitude I. Each switch $M_k$ is controlled by control signal $B_k$. The shapes of the control signals are selected so that at any given time, one and only one of the control signals $B_k$ is high. As a result of this, switch $M_k$ conducts the entire current I to its output when $B_k$ is high. Therefore, the current $i_k$ (for $k=1$ to n) at the output of $M_k$ has an average value $I_k$ equal to $2^{k-n-1}*I$. Each output current $i_k$ is passed through an associated low pass filter to produce a dc current with total ripple negligible compared to $I_1$ (e.g., less than one-eighth $I_1$). These dc currents are the binary scaled currents suitable for use in a D/A converter.

To eliminate errors in the $I_k$ due to errors in the timing of the control signals, a pair of complementary switches $M_{C0}$ and $M_{C1}$ are connected between the source of current I and the switches $M_k$. These switches act to supply the current I to the input of switches $M_k$ as a series of equal pulses. The timing of the pulses is such that none of the control signals makes a transition during one of these pulses. Therefore, the current $i_k$ is a series of these pulses of current I and the average rate of such pluses in $i_k$ is $2^{k-1}$ times the rates of pulses in $i_1$.

There are two preferred embodiments of the weighted duty cycle scheme. In first of these, referred to herein as the "weighted pulse width" (WPW) scheme, each of the control signals is a periodic signal of period T and the shape of control signal $B_k$ (for $k=1$ to n) is such that it is high within each period T for one continuous pulse of width $2^{k-n-1}*T$. In the other of these preferred embodiments referred to herein as the "weighted repetition-rate" (WRR) scheme, $B_k$ (for $k=1$ to n) is a periodic signal and consists of $2^{k-1}$ disjoint pulses of width $2^{-n}*T$ where T is the group pattern repetition period for the set of all $B_k$.

There are two primary sources of error in the WDC scheme. The first source of error is caused by the parasitic capacitance $C_p$ at the common input to switches $M_k$. Field effect are a convenient choice for the switches $M_k$. The application of pulses of current to the common input produces at this common input an alternation between high and low voltage values at the same frequency as the current pulses. Because of unavoidable differences in gate voltage and in threshold voltage between field effect transistor switches $M_k$, these high and low values will not be identical. This results in a net transfer of charge to the parasitic capacitance during some of periods in which a single switch $M_k$ is conductive. This net transfer of charge to or from the parasitic capacitance causes a similar difference in the desired pulse through $M_k$. The effect on $I_k$ is proportional to the number of transitions per unit time in control signal $B_k$ and therefore the problem is more serious in the weighted repetition-rate scheme in which the number of transitions per unit time in control signal $B_k$ is $2^{k-1}$ times the number of transitions per unit time in control signal $B_1$. The second source of error is the residual ripple that appears in the outputs in addition to the dc currents $I_k$. The low pass filters are selected to make this error in each $I_k$ be negligible compared to $I_1$ (e.g., less than one-eighth of $I_1$).

DESCRIPTION OF THE PREFERRED EMBODIMENT

Figure 1:
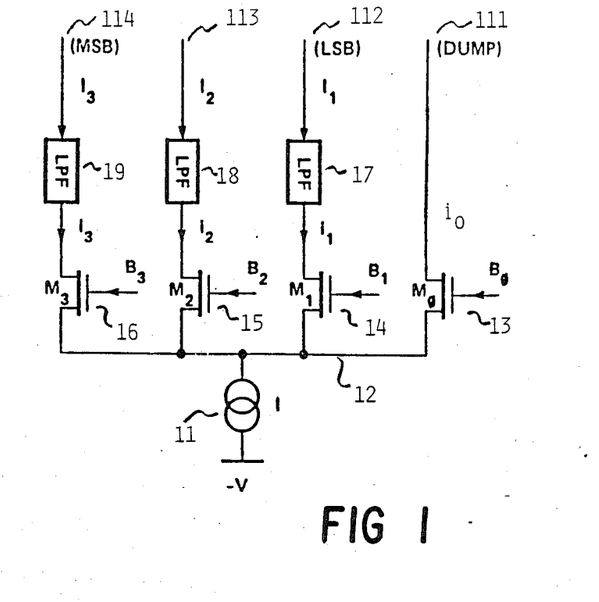
FIG. 1 is a block diagram of a binary scaled current source utilizing the weighted duty cycle (WDC) scheme.

In the Figures, the first digit of the reference numerals will indicate the first figure in which that element is presented. In FIG. 1 is presented, for the special case $n=3$, a block diagram of an n-bit binary scaled current source illustrating the use of a weighted duty cycle (WDC) scheme for generating the binary scaled currents. A current source 11 supplies a current I to a rail 12 to which are connected the inputs of a set of switches $M_0, \ldots, M_n$ such as field effect transistors 13-16. The kth switch $M_k$ is turned on and off in response to a kth control signal such as control signal $B_k$ applied to the gate of transistor $M_k$ in FIG. 1. The duty cycle of the kth control signal $B_k$ is $2^{k-1}$ times the duty cycle of the zeroth control signal $B_0$ and first control signal $B_1$. The timing and shape of the control signals is selected so that one and only one of the control signals is high at a given time so that one and only one of the switches is conductive at a given time. As a result of this, in the output of the kth switch is produced a current $i_k$ that is equal to I during a fraction $2^{k-n-1}$ of the cycle and is zero during the remainder of the cycle.

Each current $i_k$ (for $k=1$ to n) is passed through a low pass filter that produces a dc current $I_k$ of magnitude $2^{k-n-1}*I$. The currents $I_1$ and $I_n$ represent the least significant bit (LSB) and the most significant bit (MSB) of binary scaled currents, respectively. The current $i_0$ is not one of the binary scaled currents and therefore is not supplied to the control section of a D/A converter for production of the output of the D/A converter. Current $i_0$ can be dumped, for example, to ground.

Figure 2:
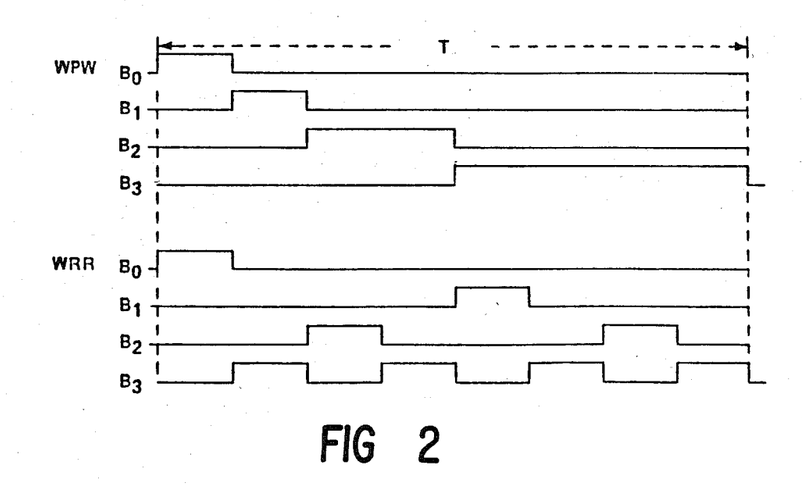
FIG. 2 shows control signals suitable for use in the weighted pulse width (WPW) and weighted repetition-rate (WRR) embodiments of the WDC scheme.

Two particular shapes of the control signals are particularly easy to produce and are presented in FIG. 2. These two schemes are referred to herein as the weighted pulse width (WPW) scheme and the weighted repetition rate (WRR) scheme. In both of these schemes, the control signals are periodic with a group pattern repetition period T in which all of the control signals repeat their patterns. In the WPW scheme, in a single period of the kth control signal $B_k$ (for $k=1$ to n), the control signal contains a single pulse of duration $2^{k-n-1}*T$. In the WRR scheme, in a single group pattern repetition period T, the control signal $B_k$ (for $k=1$ to n) contains $2^{k-1}$ pulses of duration $2^{-n}*T$. The timing of the pulses in both types of signals is such that one and only one control signal is high at a given time. The generation of these control signals will be discussed below in respect to FIGS. 9–12.

The precision with which the $I_k$ are generated is dependent on the precision with which the duty cycles of the control signals are generated. The error in the duty cycle of each of the control signals should be small compared to the duty cycle of $B_0$ and $B_1$ so that the currents can be summed to produce a total D/A converter output current that is accurate to within a small fraction of the value of the least significant binary scaled current $I_1$. This limitation can place a severe limit on the number n of bits of accuracy that can be produced by this scheme. Therefore, in FIG. 3 is shown an embodiment of a weighted duty cycle type binary scaled current source that eliminates this sensitivity to the precision of the duty cycle of the control signals.

Figure 3:
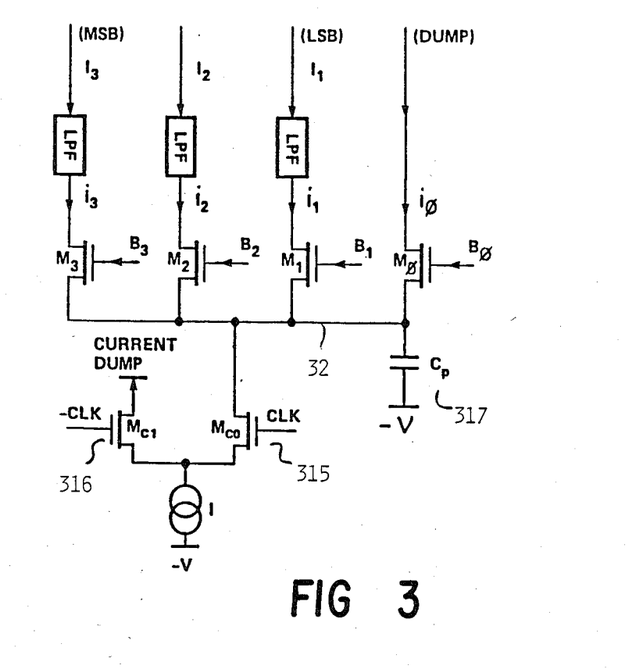
FIG. 3 is a block diagram of a binary scaled current source in which a source current is pulsed to remove errors in the binary scaled currents due to timing errors in the control signals.
Figure 4:
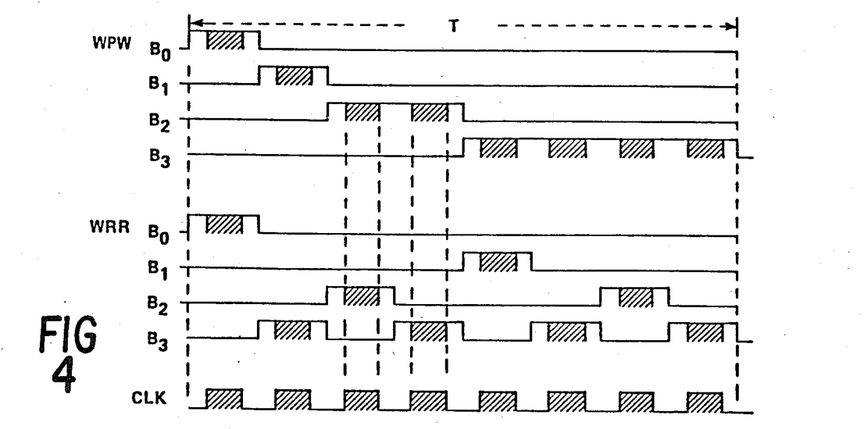
FIG. 4 illustrates timing relation between the control signals and the current pulses.

In FIG. 3, a pair of switches $M_{C0}$ and $M_{C1}$, such as field effect transistors 315 and 316, are included in the circuit of FIG. 1. The purpose of these additional switches is to provide the current I to switches $M_0, \ldots, M_n$ in pulses that do not overlap any transition in a control signal. To distinguish reference to the two types of switches, $M_{C0}$ and $M_{C1}$ will be referred to as the pulse switches and $M_0, \ldots, M_n$ will be referred to as the binary switches. $M_{C0}$ is responsive to a clock signal, CLK, and $M_{C1}$ is responsive to the complement, $-$CLK, of the clock signal. In FIG. 4 is illustrated the relationship between the current pulses (which occur during the cross-hatched intervals) supplied to the binary switches and the control signals for the binary switches.

The pulse switches function to direct the current I to the binary switches only in those intervals in which the clock signal is high. As will be discussed in more detail in reference to FIG. 7, the control signals and the clock signal are generated in response to the output of the same crystal oscillator. Because current flows to the binary switches only during a pulse in CLK and no control signals make a transition during any of these pulses, the duration of current flowing through each of the binary switches is unaffected by small errors in the timing or shape of the transitions in the control signals $B_0, \ldots, B_n$.

There are two main sources of error in the weighted duty cycle scheme. The first source of error arises due to a parasitic capacitance 317 at source rail 32 to which the inputs of the binary switches are connected. The value of this parasitic capacitance is represented by $C_p$. The cause of this error can be understood by reference to FIG. 5A in which, for the weighted repetition rate scheme, are presented the clock signal CLK, the control signals $B_1, \ldots, B_3$ for the case of a 3-bit binary scaled current source, the voltage V of source rail 32 and the current i to parasitic capacitance 317.

Figure 5A:
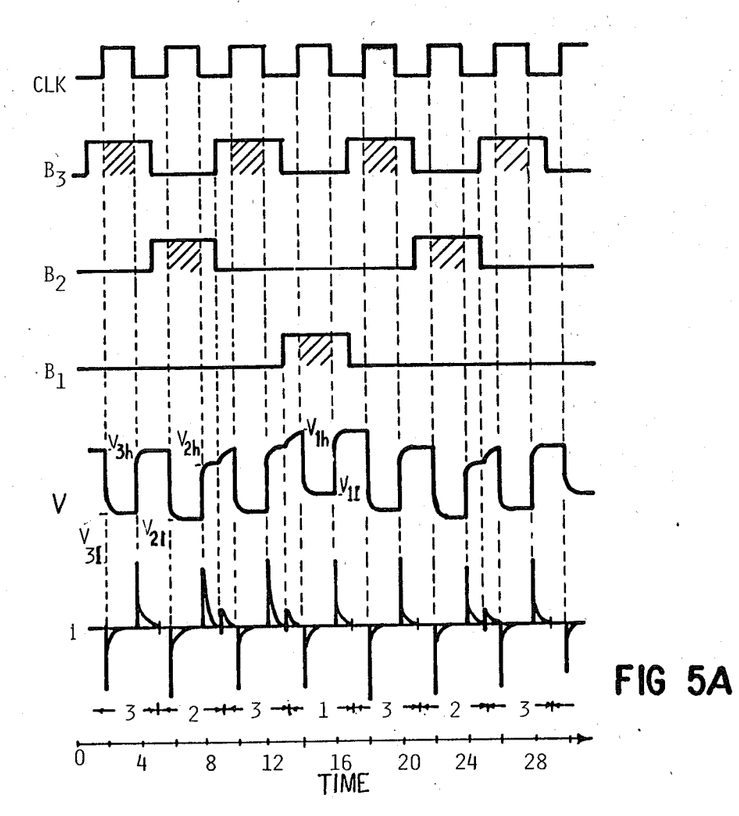
FIG. 5A illustrates the current errors that result from parasitic capacitance at the common input to the switches $M_k$.
Figure 5B:
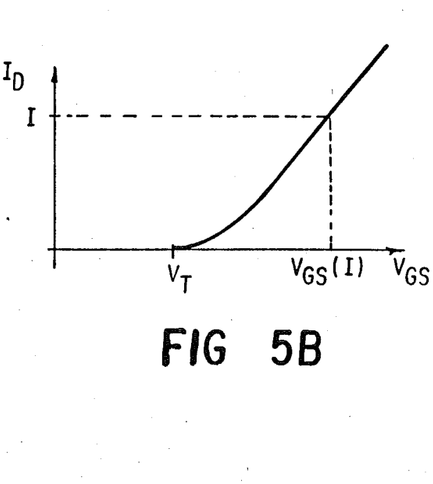
FIG. 5B illustrates a typical drain current versus gatesource voltage relationship of a MOSFET device.

The time variation of the voltage V of source rail 32 can be understood by reference to FIG. 5B which presents a typical plot of drain current $I_D$ versus gate-to-source voltage $V_{GS}$. In that figure, VT is the threshold gate-to-source voltage at which $I_D$ is substantially zero and $V_{GS}(I)$ is the value of the gate-to-source voltage at which $I_D$ equals the current I of current source 11. When pulse switch $M_{C0}$ is off, capacitance 317 will be charged by the binary switch $M_k$ which has the only high control voltage $B_k$ until voltage V rises to the level at which switch $M_k$ becomes nonconductive. Therefore, the high voltage is $V_{kh} = V_{kG} - V_{Tk}$ and the low voltage is $V_{kl} = V_{kG} - V_{kGS}(I)$, where $M_k$ is the binary switch with the high control voltage, $V_{kG}$ is the high value of the gate voltage for $M_k$, $V_{kT}$ is the threshold voltage of $M_k$ and $V_{kGS}(I)$ is the gate-to-source voltage for which the drain current of $M_k$ is equal to I.

When these high and low values are not equal for all switches due to imperfect match between binary switches $M_k$ as shown in an exaggerated example in FIG. 5A, the parasitic capacitance will affect the net charge transferred through a switch while it is conductive. The charge transferred to parasitic capacitance 317 during a transition in the voltage on rail 32 is equal to the area under a current spike in the current i to the parasitic capacitance at the time of the transition. This area is proportional to the parasitic capacitance and is also proportional to the change in voltage V at that transition. During the first pulse in $B_3$ from $t=1$ to $t=5$, there is no net transfer of charge to the parasitic capacitance because the voltage at $t=1$ is equal to the voltage at $t=5$. Because of this, the areas of the current spikes in i at $t=2$ and $t=4$ are equal in magnitude, but are of opposite sign so that no net charge is transferred to the parasitic capacitance between $t=1$ and $t=5$.

However, since at $t=5$, the voltage is not equal to the voltage at $t=9$, the net charge transferred to the parasitic capacitance during that interval is non-zero. Since switch $M_2$ is conductive during that interval, this will result in an error in the value of $I_2$. Since pulses in $B_2$ always follow pulses in $B_3$, this same error will occur in every transfer of charge through switch $M_2$ and therefore the error in $I_2$ will be proportional to the rate of occurrence of such pulses in $B_2$. Therefore, this problem will be much more serious in the weighted repetition-rate scheme than in the weighted pulse width scheme because of the increased number of transitions in the weighted repetition-rate scheme.

The net error current $I_{err}$ for a kth output is:

$$I_{err} = v * C_p * F_k$$

where $F_k$ is the fundamental frequency of $B_k$ and v is the average value of the differences in voltage V between the time of beginning and end of the pulses in $B_k$. For a 12-bit binary scaled current source (i.e., $n=12$), a parasitic capacitance of 10 pF, a value of 100 mV for v, and a current $I_n = 10$ mA, the weighted repetition rate scheme is limited to a clock rate of at most 1.2 MHz if $I_{err}$ is to be less than one-eighth of $I_1$. For a 12-bit binary scaled current source, $F_n$ is 2048 times larger in the weighted repetition rate scheme than in the weighted pulse width scheme and therefore, under otherwise equal conditions, the clock rate can be 2048 times faster in the WPW scheme than in the WRR scheme.

Figure 6:
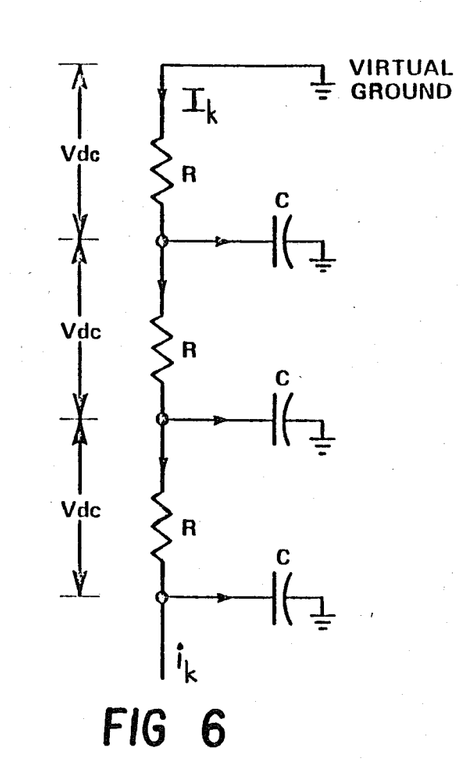
FIG. 6 shows a low pass filter, suitable for use in the binary scaled current source.
Figure 7:
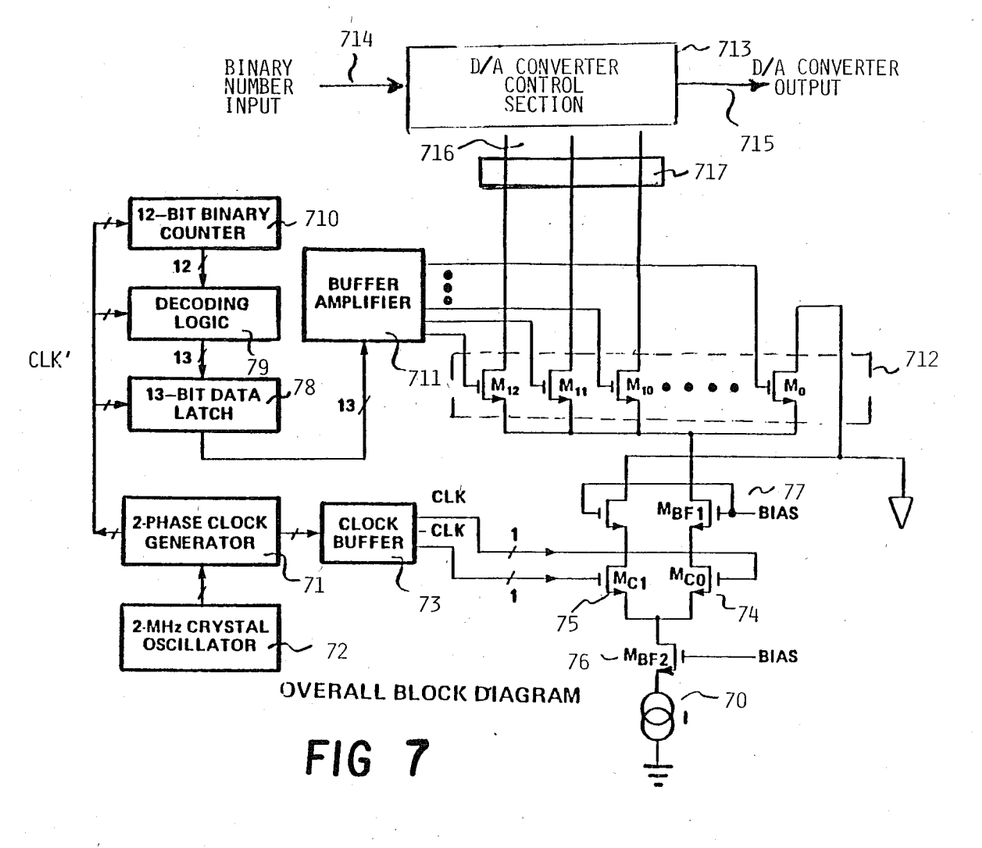
FIG. 7 is an overall block diagram of a D/A converter utilizing the weighted duty cycle scheme.

The second source of error is the residual ripple in each output current after the $i_k$ associated with that output is filtered through its associated low pass filter. A low pass filter suitable for use in this binary scaled current source is the filter in FIG. 6. This filter consists of three RC filters in series. The resistance R in each filter is chosen to produce a convenient value (e.g., 1 volt) of dc drop $V_{dc}$ across each stage of that filter. The capacitance C is then chosen so that the peak-to-peak value of the residual ripple is negligible compared to $I_1$ (e.g., less than one-eighth of $I_1$). This requires that the value of the capacitance C in the filter for the most significant current $i_k$ be:
for the weighted repetition-rate scheme: $0.2 * I * 2^{-2n/3} * T/V_{dc}$
for the weighted pulse width scheme: $0.09 * I * 2^{n/3} * T/V_{dc}$ In FIG. 7 is an overall block diagram of a D/A converter that includes a binary scaled current source that utilizes the weighted duty cycle scheme. A current source 70 provides a current I that is controllably switched to produce binary weighted currents. A 2-phase clock generator 71 is responsive to an output signal from a crystal oscillator 72 to produce a pair of clock signals that are phase shifted by 90 degree with one another. A first of these clock signals is supplied to a clock buffer which produces a clock signal CLK and its complementary −CLK. Pulse switches 74 and 75 are responsive to CLK and −CLK respectively and are connected to current source 70 to provide pulses of current to the inputs of a set of binary switches 712. A pair of buffers 76 and 77 buffer the pulse switches so that the duty cycle of the pulses is not modulated by signals present at other points in the binary scaled current source.

The second of the clock signals CLK' is applied to an n-bit binary counter 710, decoding logic 79 and an n+1 bit data latch. In response to the output of binary counter 710, decoding logic 79 produces a set of n+1 digital control signals. In response to the second clock signal, data latch applies each of the 13 control signals through a buffer amplifier 711 to the gate of an associated one of the binary switches. The current of the switch $M_0$ in FIG. 7 is dumped; the currents of the n switches $M_1, \ldots, M_n$ in FIG. 7 feed a set of low pass filters 717. The resulting binary scaled currents are supplied on a set of n lines 716 to a control section 713 of the D/A converter. The kth least significant current $I_k$ is associated with the kth least significant bit of a binary number entered on an input 714 to control section 713. For those bits in the binary number that are ones, their associated binary scaled current is directed to an output 715 of the D/A converter so that the output current is proportional to the binary number.

Figure 8:
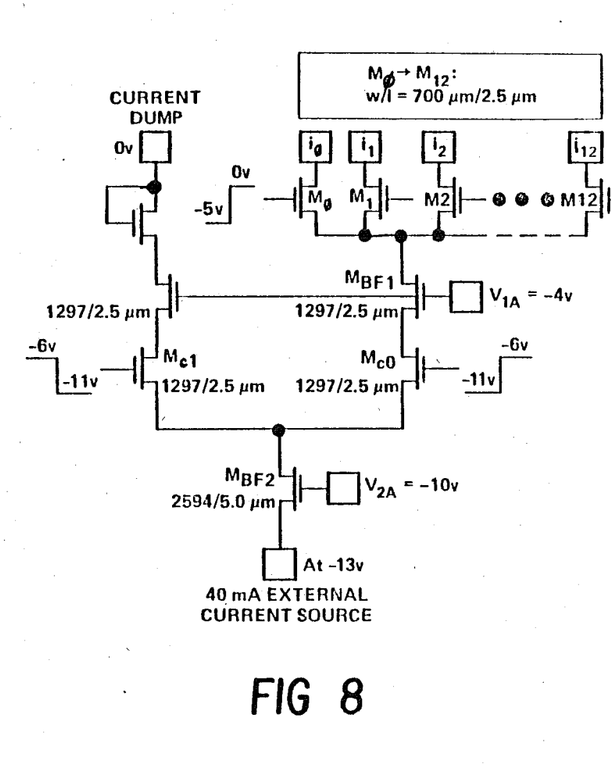
FIG. 8 presents typical parameter values for the signal levels and the width to length ratios of transistors.
Figure 9:
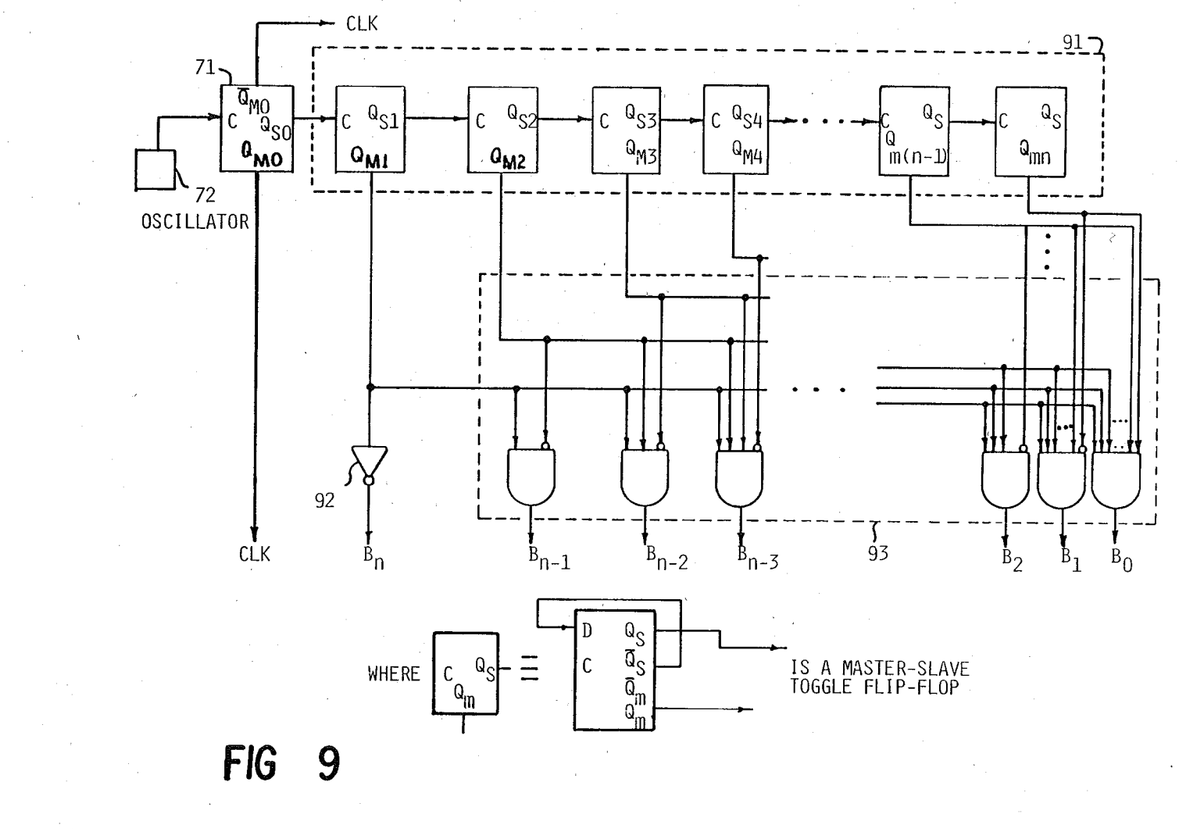
FIG. 9 is a block diagram of a binary counter and decoding logic to generate control signals for use in the WRR scheme.
Figure 10:
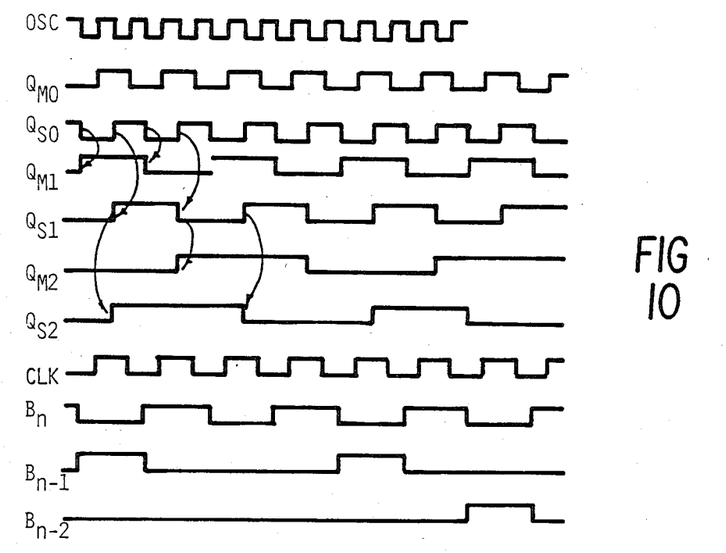
FIG. 10 presents the signals involved in the circuit of FIG. 9.
Figure 11:
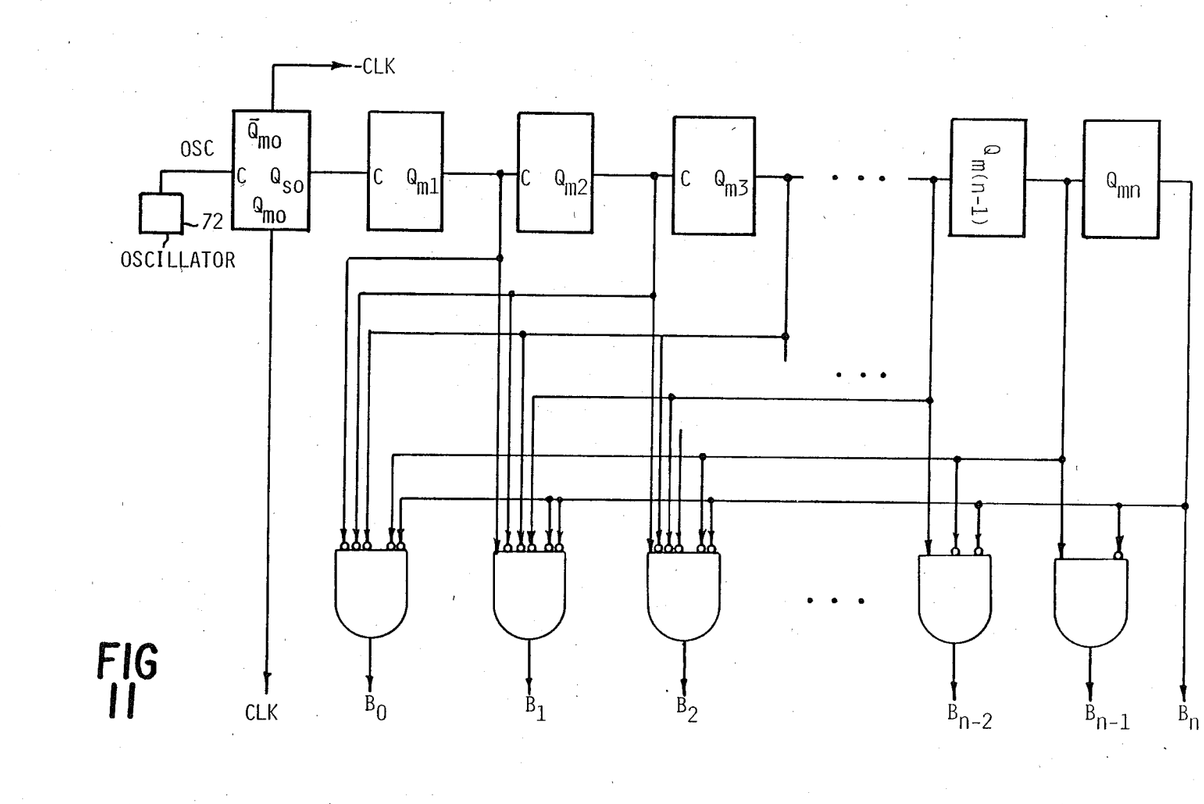
FIG. 11 is a block diagram of a binary counter decoding logic to generate control signals for use in the WPW scheme.
Figure 12:
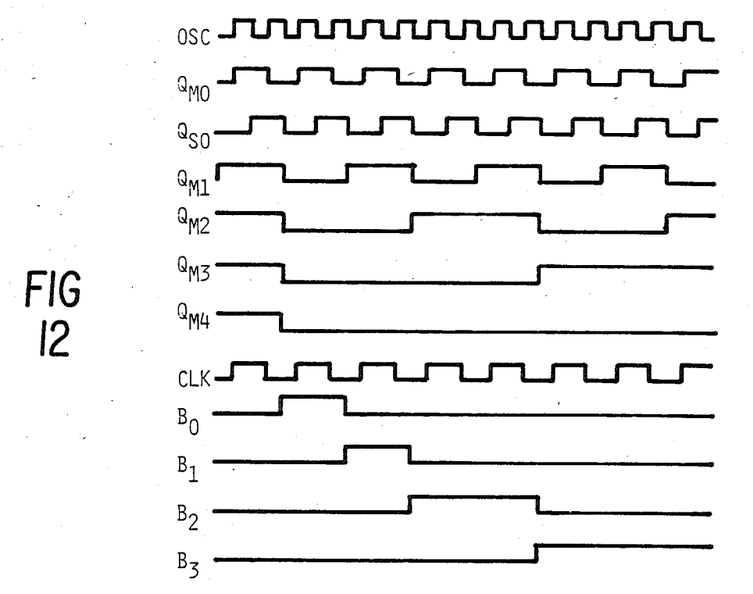
FIG. 12 presents the signals involved in the circuit of FIG. 11.

In FIG. 8 are shown representative values of width-to-length ratios for various MOS transistors and voltage levels of various signals in an embodiment utilizing the weighted duty cycle scheme. In FIG. 9 is presented a circuit suitable for use as 2-phase clock generator 71, binary counter 710 and decoding logic 79 for the WRR scheme. This circuit utilizes a section 91 of n master slave toggle flip-flops connected in cascade. The output $Q_m$ and the output $Q_s$ of each of the flip-flops is the master output and the slave output, respectively. A NOT gate 92 and a set 93 of AND gates are each connected to master outputs to produce the control signals $B_k$. The relations between the signals in this circuit are shown in FIG. 10. FIGS. 11 and 12 are analogous to FIGS. 9 and 10 for the WPW scheme.

We claim:

1. A binary scaled current source comprising:

a set of n switches $M_1, \ldots, M_n$, referred to herein as binary switches, each having an output and each having an input connected in parallel with the inputs of the other binary switches to a common input, each of said binary switches being responsive to an associated control signal, the control signal for the kth switch $M_k$ being designated as $B_k$;

a dc current source connected to the common input of the binary switches to supply a current I to the binary switches;

control signal means, connected to the switches $M_k$, for generating the control signals $B_k$ so that at any given time one and only one of the control signals is high and so that the fraction of time that control signal $B_k$ is high (referred to herein as the duty cycle of $B_k$) is equal to $2^{k-1}$ times the duty cycle of $B_1$, thereby producing through the kth switch $M_k$ (for $k=1,\ldots,n$) a current $i_k$ that has a dc component $I_k$ that is $2^{k-1}$ times the dc component $I_1$ of i; and pulse means, connected between said dc current source and said common input, for providing to the common input a pulsed current $I_p$ which consists of a periodic sequence of pulses of amplitude I, the timing of the transitions in the control signals $B_k$ and the pulsed current source being such that no transition in any of the control signals $B_k$ occur during any of the current pulses.

* * * * *